(12) United States Patent
Han

(10) Patent No.: US 9,048,205 B2
(45) Date of Patent: Jun. 2, 2015

(54) ORGANIC LIGHT EMITTING DIODE DISPLAY

(71) Applicant: Samsung Display Co., Ltd., Yongin, Gyeonggi-Do (KR)

(72) Inventor: Byung-Uk Han, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/285,920

(22) Filed: May 23, 2014

(65) Prior Publication Data

US 2015/0041774 A1 Feb. 12, 2015

(30) Foreign Application Priority Data

Aug. 7, 2013 (KR) .......................... 10-2013-0093813

(51) Int. Cl.
*H01L 27/32* (2006.01)
*H01L 51/56* (2006.01)

(52) U.S. Cl.
CPC ............ *H01L 27/3232* (2013.01); *H01L 51/56* (2013.01); *H01L 27/323* (2013.01)

(58) Field of Classification Search
CPC .... H01L 27/3232; H01L 27/323; H01L 51/56
See application file for complete search history.

(56) References Cited

U.S. PATENT DOCUMENTS 8,456,085 B2 * 6/2013 Han .............................. 313/512

FOREIGN PATENT DOCUMENTS

| KR | 100392956 B1 | 7/2002 |
| KR | 1020060023497 A | 3/2006 |
| KR | 101002659 B1 | 7/2010 |
| KR | 1020110017248 A | 2/2011 |
| KR | 1020120022514 A | 3/2012 |

* cited by examiner

*Primary Examiner* — Roy Potter
*Assistant Examiner* — Paul Patton
(74) *Attorney, Agent, or Firm* — Cantor Colburn LLP

(57) ABSTRACT

An organic light emitting diode includes: a substrate; an encapsulation substrate facing the substrate and including a transmission region through which light is transmitted and an absorption region through which the light is not transmitted; a sealant between the substrate and the encapsulation substrate; and a pixel unit between the substrate and the encapsulation substrate, and including a plurality of pixels respectively including an organic light emitting element. The absorption region of the encapsulation substrate includes photoreactive crystals.

14 Claims, 5 Drawing Sheets

ORGANIC LIGHT EMITTING DIODE DISPLAY

This application claims priority to Korean Patent Application No. 10-2013-0093813 filed on Aug. 7, 2013, and all the benefits accruing therefrom under 35 U.S.C. §119, the entire contents of which are incorporated herein by reference.

BACKGROUND (a) Field

The invention relates to an organic light emitting diode ("OLED") display.

(b) Description of the Related Art

A display device is a device displaying an image, and a display device including an OLED is receiving attention.

Since the OLED display has a self-light emitting characteristic and a separate light source is not employed unlike a liquid crystal display, thickness and weight of the entire display device including the OLED may be reduced to improve a flexible characteristic of the display device. Further, the OLED display has high-quality characteristics such as low power consumption, high luminance and high reaction speed.

The OLED display is portable so as to be capable of being used outside, and is manufactured to have reduced weight and thickness in order to satisfy the aforementioned objectives.

However, when an image is viewed outside, there is a problem in that since sunlight is reflected by a metal reflective layer within the OLED display, contrast and visibility are deteriorated.

SUMMARY

The invention provides an organic light emitting diode ("OLED") display reducing reflection of external light without increasing a thickness of the OLED display.

An OLED display according to an exemplary embodiment of the invention includes: a substrate; an encapsulation substrate facing the substrate and including a transmission region and an absorption region; a sealant between the substrate and the encapsulation substrate; and a pixel unit between the substrate and the encapsulation substrate, and including a plurality of pixels respectively including an organic light emitting element. The absorption region includes photoreactive crystals.

The photoreactive crystals may include at least one of AgCl, AgBr and AgI.

A size of the photoreactive crystals may be in a range from about 50 angstroms (Å) to about 300 Å.

The transmission region may correspond to a region of an organic emission layer of each organic light emitting element.

The absorption region may enclose the transmission region.

The pixel unit may further include a thin film transistor, a pixel definition layer, and an opening defined in the pixel definition layer. The organic light emitting element may include a first electrode connected to the thin film transistor, an organic emission layer on the first electrode, and a second electrode on the organic emission layer. The opening in the pixel definition layer may expose the first electrode of the organic light emitting element, and the organic emission layer may be within the opening in the pixel definition layer and on the first electrode exposed by the opening.

The absorption region may correspond to the pixel definition layer.

The transmission region may correspond to the opening.

The OLED display may further include a touch panel including: a first sensing wire and a second sensing wire respectively disposed at opposing surfaces of the encapsulation substrate, and insulated from and crossing each other.

The OLED display may further include a touch panel including a first sensing wire and a second sensing wire both disposed on a same surface of the encapsulation substrate, and insulated from and crossing each other.

In one or more exemplary embodiment of the invention, when forming the OLED display including the encapsulation substrate having the photoreactive crystals, visibility reduction due to external light may be reduced or effectively prevented without increasing the thickness of the OLED display.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
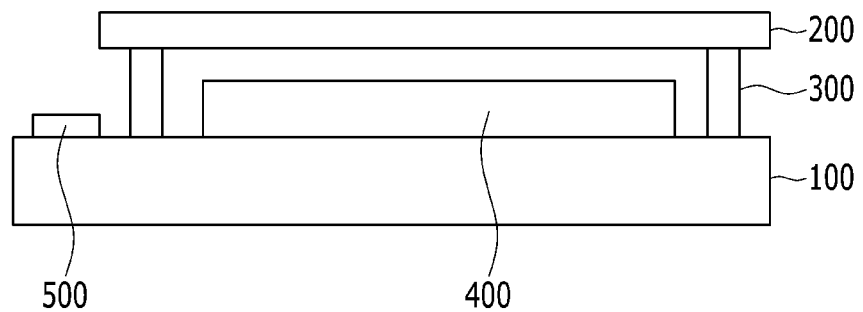
FIG. 1 is a schematic cross-sectional view of an exemplary embodiment of an organic light emitting diode ("OLED") display according to the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

The drawings and description are to be regarded as illustrative in nature and not restrictive. Like reference numerals designate like elements throughout the specification.

Furthermore, as the size and thickness of the respective structural components shown in the drawings are arbitrarily illustrated for explanatory convenience, the invention is not necessarily limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

When an image of an organic light emitting diode ("OLED") display is viewed outside, there is a problem in that since sunlight is reflected by a metal reflective layer within the OLED display, contrast and visibility are deteriorated.

In order to solve the problem, a circularly polarizing plate is disposed on the OLED display. However, in disposing a polarizing plate on the OLED display, an adhesion layer and a protection layer such as tri-acetyl cellulose ("TAC") are included, which increases the thickness and rigidity of the OLED display. Accordingly, there is a limit in increasing flexibility of the OLED display. Further, there is a problem in that a possibility of forming defects caused by foreign particles and the like is increased due to a process because a plurality of layers is laminated. Therefore, there remains a need for an improved OLED display having improved visibility in outdoor environments, and improved flexibility.

In addition, in the accompanying drawings, a "2Tr 1Cap" structured active matrix ("AM") type OLED display in which a pixel includes two thin film transistors ("TFTs") and one capacitor is illustrated. However, the invention is not limited thereto. Therefore, an OLED display may have various structures in which a pixel may include a plurality of TFTs and at least one capacitor, a wiring line may be further disposed, and a conventional wiring line may be omitted. Here, a pixel refers to a minimum unit that displays an image, and an OLED display displays an image through a plurality of pixels.

Now, an exemplary embodiment of an OLED display according to the invention will be described in detail with reference to accompanying drawings.

Figure 2:
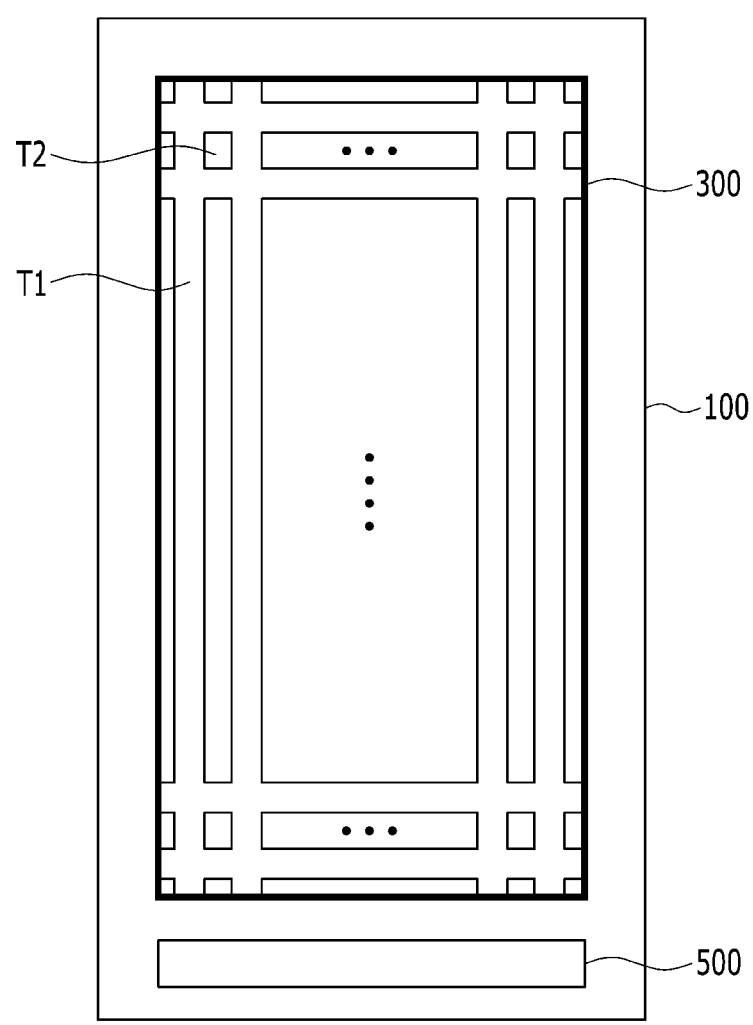
FIG. 2 is a schematic top plan view of an exemplary embodiment of an OLED display according to the invention.

FIG. 1 is a schematic cross-sectional view of an OLED display according to the invention, and FIG. 2 is a schematic top plan view of an OLED display according to the invention.

As shown in FIG. 1, an OLED display includes a substrate 100 and an encapsulation substrate 200 facing each other, and the substrate 100 and the encapsulation substrate 200 are coupled to each other by a sealant 300.

A pixel unit 400 including a plurality of pixels each including a thin film transistor and an organic light emitting element, and a driver 500 configured to drive the pixel unit 400, are disposed on the substrate 100.

The substrate 100 may be, for example, a transparent insulating substrate including glass, quartz, ceramic, or a polymer material, or a metal substrate including stainless steel. The polymer material may include an organic material selected from insulation organic materials, such as polyether sulfone ("PES"), polyacrylate ("PAR"), polyetherimide ("PEI"), polyethylene naphthalate ("PEN"), polyethylene terephthalate ("PET"), polyphenylene sulfide ("PPS"), polyallylate, polyimide, polycarbonate ("PC"), triacetyl cellulose ("TAC"), and cellulose acetate propionate ("CAP").

The driver 500 includes a driving circuit to drive the pixel unit 400. The driving circuit may be integrated on the substrate along with the pixel or may be mounted on the substrate 100 as an integrated circuit ("IC") chip. The driver 500 is electrically connected to the pixel unit 400 by a plurality of signal lines, and each pixel of the pixel unit 400 is controlled by a driving signal transmitted through the plurality of signal lines thereby displaying an image.

Referring to FIG. 2, the encapsulation substrate 200 includes a transmission part transmitting light and an absorption part reflecting light. The encapsulation substrate 200 includes a borosilicate glass including photoreactive crystals 55. The photoreactive crystals 55 may include at least one of AgCl, AgBr and AgI and are included in the encapsulation substrate 200 in a crystalline state.

The transmission part of the encapsulation substrate 200 is positioned at a display area T1 at which the light is emitted from the pixel unit thereby displaying the image, and the absorption part of the encapsulation substrate 200 is positioned at a non-display area T2 enclosing a region where the light is emitted. The display area T1 may be a region corresponding to an emission layer of an organic light emitting element that is disposed in each pixel of the pixel unit. The photoreactive crystals 55 may be omitted in portions of the encapsulation substrate 200 at the display area T1.

The photoreactive crystals 55 of the absorption part T2 absorb the light while Ag ions are changed into Ag atoms when the light is irradiated, thereby blocking the light. Also, if the light is not irradiated, the Ag atoms are again combined with Cl, Br, or I atoms to form the photoreactive crystals such that the light transmission state is realized, however there is no external light such that the external light is not transmitted.

When only using AgCl as the photoreactive crystals, ultraviolet ("UV") rays near about 190 nanometers (nm) may be absorbed. However, when including AgBr, substantially an entire of visible rays in a visible region may be absorbed.

If a size of the photoreactive crystals is less than about 50 angstroms (Å), the photoreactive crystals react with the light such that there is no light absorption effect. If the size of the photoreactive crystals is over about 300 Å, scattering is generated. In one exemplary embodiment, the size of the photoreactive crystals is in a range of more than about 50 Å and less than about 300 Å.

The size of the crystals is made possible by heat treatment. In an exemplary embodiment, the crystals may be formed by using a laser or by joule heating a metal. When performing the heat treatment by using the joule heating, the joule heat may be formed by using a wire of a touch panel.

The sealant 300 is disposed according to an edge of the substrate 100 and the encapsulation substrate 200 to enclose the pixel unit 400 therebetween, and to form a closed and sealed space along with the substrate 100 and the encapsulation substrate 200, thereby protecting the pixel unit 400 from an external environment.

Next, the pixel of the OLED display will be described with reference to FIG. 1 and FIG. 2.

Figure 3:
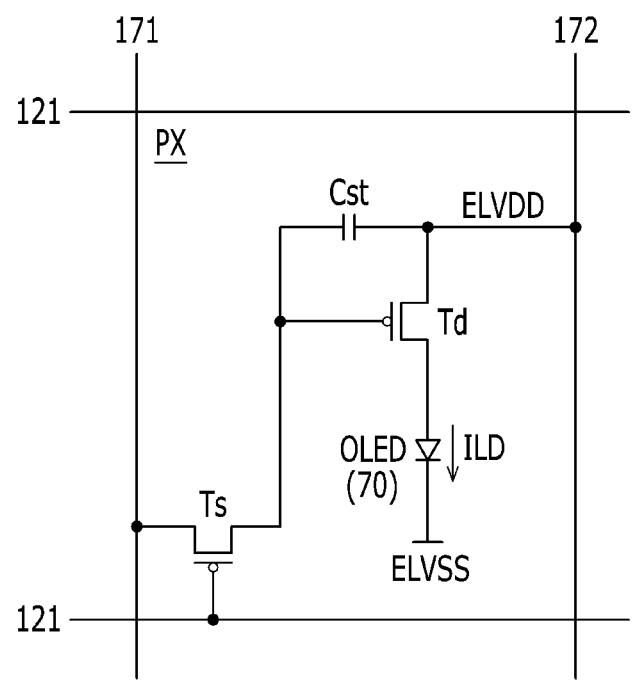
FIG. 3 is an equivalent circuit of an exemplary embodiment of one pixel of an OLED display according to the invention.

FIG. 3 is an equivalent circuit of an exemplary embodiment of one pixel of an OLED display according to the invention.

As shown in FIG. 3, the pixel of the OLED display includes a plurality of signal lines 121, 171 and 172, and a plurality of pixels PX connected to the signal lines 121, 171 and 172 and arranged in a matrix form.

The signal lines include a plurality of scan lines 121 for transmitting scan signals (or gate signals), a plurality of data lines 171 for transmitting data signals, and a plurality of driving voltage lines 172 for transmitting a driving voltage ELVDD. The scan lines 121 run parallel with each other in a row direction, and the data lines 171 and the driving voltage lines 172 run parallel with each other in a column direction. Each of the pixels PX includes a switching thin film transistor Ts, a driving thin film transistor Td, a storage capacitor Cst and an OLED 70.

The switching thin film transistor Ts has a control terminal, an input terminal and an output terminal. The control terminal is connected to the scan line 121, the input terminal is connected to the data line 171 and the output terminal is connected to the driving thin film transistor Td. The switching thin film transistor Ts transmits a data signal applied to the data line 171 to the driving thin film transistor Td in response to a scan signal applied to the scan lines 121.

The driving thin film transistor Td also has a control terminal, an input terminal and an output terminal. The control terminal is connected to the switching thin film transistor Ts, the input terminal is connected to the driving voltage line 172, and the output terminal is connected to the OLED. The driving thin film transistor T2 causes an output current ILD to flow, which varies in amplitude in accordance with a voltage applied between the control terminal and the output terminal.

The storage capacitor Cst is connected between the control terminal and input terminal of the driving thin film transistor Td. The storage capacitor Cst charges a data signal applied to the control terminal of the driving thin film transistor Td, and maintains the data signal after the switching thin film transistor Ts is turned off.

The OLED 70 has an anode connected to the output terminal of the driving thin film transistor Td and a cathode connected to a common voltage ELVSS. The OLED 70 displays an image by emitting light with different intensities according to an output current ILD of the driving thin film transistor Td.

Next, a detailed structure of the pixel of the OLED display shown in FIG. 3 will be described with reference to FIG. 4 and FIG. 5.

Figure 4:
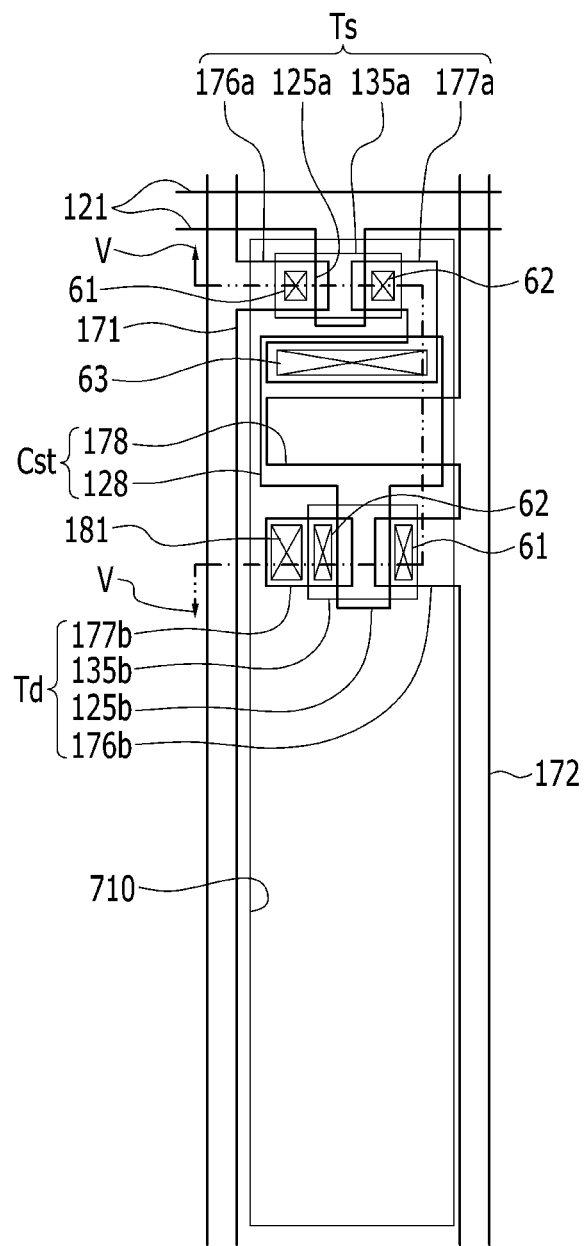
FIG. 4 is a plan view of an OLED display according to the invention.
Figure 5:
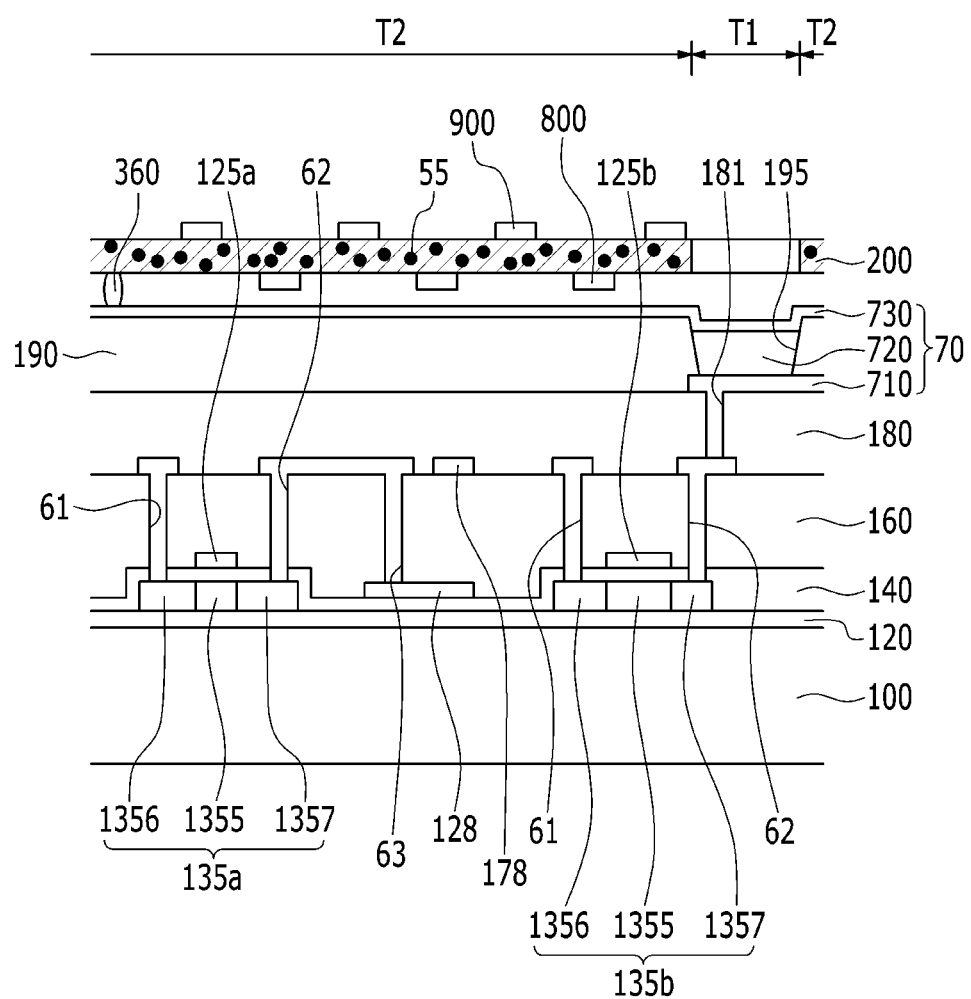
FIG. 5 is a cross-sectional view taken along line V-V of FIG. 4.

FIG. 4 is a plan view of an exemplary embodiment of an OLED display according to the invention, and FIG. 5 is a cross-sectional view taken along line V-V of FIG. 4.

As shown in FIG. 4 and FIG. 5, a buffer layer 120 is disposed on a substrate 100 of an OLED display.

The buffer layer 120 may have a single-layer structure of silicon nitride (SiNx), or a dual-layer structure of silicon nitride (SiNx) and silicon oxide (SiO2) laminated to each other.

The buffer layer 120 prevents penetration of unnecessary elements, such as impurities or moisture to components of the OLED display, and helps planarize the surface.

A switching semiconductor 135a and a driving semiconductor 135b are disposed on the buffer layer 120, and are spaced apart from each other.

These semiconductors 135a and 135b may include a polysilicon or oxide semiconductor.

The oxide semiconductor may include one selected from oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). If the semiconductors 135a and 135b include the oxide semiconductor, a separate protective layer (not shown) may be added to protect the oxide semiconductor from the outside environment such as from a high temperature.

The switching semiconductor 135a and the driving semiconductor 135b are respectively divided into a channel region 1355, and a source region 1356 and drain region 1357 respectively disposed at sides of the channel region 1355. The impurities in the semiconductors vary according to the type of thin film transistor including the semiconductors, and may be N-type impurities or P-type impurities.

The channel regions 1355 of the switching semiconductor 135a and the driving semiconductor 135b may include polysilicon not doped with impurities, that is, an intrinsic semiconductor, and the source regions 1356 and drain regions 1357 of the switching semiconductor 135a and the driving semiconductor 135*b* may include polysilicon doped with conductive impurities, that is, an impurity semiconductor.

A gate insulating film 140 is disposed on the switching semiconductor 135*a* and the driving semiconductor 135*b*.

The gate insulating film 140 may be a single layer, or a plurality of layers including at least one of silicon nitride and silicon oxide.

A scan line 121, a driving gate electrode 125*b*, and a first storage capacitor plate 128 are disposed on the gate insulating film 140.

The gate line 121 may be the first signal line of FIG. 3, and extends in a transverse (e.g., row or horizontal) direction to transmit a scan signal. The gate line 121 includes a switching gate electrode 125*a* protruded from a main portion thereof toward the switching semiconductor 135*a*. The driving gate electrode 125*b* protrudes from the first storage capacitor plate 128 toward the driving semiconductor layer 135*b*. The switching gate electrode 125*a* and the driving gate electrode 125*b* overlap the channel regions 1355, respectively.

An interlayer insulating film 160 is disposed on the scan line 121, the driving gate electrode 125*b* and the first storage capacitor plate 128.

Like the gate insulating film 140, the interlayer insulating film 160 may include silicon nitride or silicon oxide.

Source contact holes 61 and drain contact holes 62 are defined in the interlayer insulating film 160 and the gate insulating film 140 to expose the source regions 1356 and the drain regions 1357, and storage contact holes 63 are defined therein to expose part of the first storage capacitor plate 128.

A data line 171 including a switching source electrode 176*a*, a driving voltage line 172 including a driving source electrode 176*b* and a second storage capacitor plate 178, and a switching drain electrode 177*a* and a driving drain electrode 177*b* that are connected to the first storage capacitor plate 128 are disposed on the interlayer insulating film 160. The data line 171 may be the second signal line of FIG. 3, and the driving voltage line 172 may be the third signal line.

The data line 171 transfers a data signal, and extends in a direction crossing the gate line 121. The driving voltage line 172 transfers a driving voltage, and is separated from the data line 171 and extends in the same direction as the data line 171.

The switching source electrode 176*a* protrudes from a main portion of the data line 171 toward the switching semiconductor layer 135*a*, and the driving source electrode 176*b* protrudes from a main portion of the driving voltage line 172 toward the driving semiconductor layer 135*b*. The switching source electrode 176*a* and the driving source electrode 176*b* are respectively connected to the source regions 1356 through the source contact holes 61. The switching drain electrode 177*a* faces the switching source electrode 176*a* with respect to the switching gate electrode 125*a*, the driving drain electrode 177*b* faces the driving source electrode 176*b* with respect to the driving gate electrode 125*b*, and the switching drain electrode 177*a* and the driving drain electrode 177*b* are respectively connected to the drain regions 1357 through the drain contact holes 62.

The switching drain electrode 177*a* is extended and electrically connected to the first storage capacitor plate 128 and the driving gate electrode 125*b* through the storage contact holes 63 defined in the interlayer insulating layer 160.

The second storage capacitor plate 178 protrudes from the main portion of the driving voltage line 172, and overlaps the first storage capacitor plate 128. Accordingly, the first storage capacitor plate 128 and the second storage capacitor plate 178 form the storage capacitor Cst by using the interlayer insulating film 160 as a dielectric material therebetween.

The switching semiconductor layer 135*a*, the switching gate electrode 125*a*, the switching source electrode 176*a* and the switching drain electrode 177*a* form the switching thin film transistor Ts, and the driving semiconductor layer 135*b*, the driving gate electrode 125*b*, the driving source electrode 176*b* and the driving drain electrode 177*b* form the driving thin film transistor Td.

A protective film 180 is disposed on the switching source electrode 176*a*, the driving source electrode 176*b*, the switching drain electrode 177*a* and the driving drain electrode 177*b*.

A first electrode 710 is disposed on the protective layer 180.

The first electrode 710 is electrically connected to the driving drain electrode 177*b* of the driving thin film transistor Td through a contact hole 181 defined in the interlayer insulating layer 160, thereby being the anode of the OLED 70.

The first electrode 710 may include a transparent conducting material such as indium tin oxide ("ITO"), indium zinc oxide ("IZO"), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg) or gold (Au), but not being limited thereto.

A pixel definition layer 190 is disposed on edge portions of the first electrode 710 and the protective film 180. An opening 195 is defined in the pixel definition layer 190 exposing the first electrode 710.

The pixel definition layer 190 may include a resin such as polyacrylate resin or polyimide resin, a silica-based inorganic material, or the like.

An organic emission layer 720 is disposed in the opening 195 of the pixel defining layer 190. The organic emission layer 720 includes an emission layer and a plurality of layers including one or more of a hole-injection layer ("HIL"), a hole-transporting layer ("HTL"), an electron-transporting layer ("ETL") and an electron-injection layer ("EIL"). If the organic emission layer 720 includes all of the aforementioned layers, the HIL may be positioned on the first electrode 710 serving as an anode, and the HTL, the emission layer, the ETL and the EIL may be sequentially laminated on the first electrode 710.

The organic emission layer 720 may include a red organic emission layer for emitting red light, a green organic emission layer for emitting green light and a blue organic emission layer for emitting blue light. The red organic emission layer, the green organic emission layer, and the blue organic emission layer are respectively disposed in red, green, and blue pixels of the OLED display, thereby displaying a color image.

In one exemplary embodiment, the red organic emission layer, green organic emission layer and blue organic emission layer of the organic emission layer 720 may be respectively laminated on the red pixel, green pixel and blue pixel, and a red color filter, a green color filter and a blue color filter may be disposed for the respective pixels, thereby displaying a color image. In another exemplary embodiment, a white organic emission layer for emitting white light may be collectively disposed on all of the red, green and blue pixels, and a red color filter, a green color filter and a blue color filter may be disposed for the respective pixels, thereby displaying a color image. If the white organic emission layer and the color filters are used to display a color image, a deposition mask for depositing the red, green and blue organic emission layers on the respective pixels, e.g., the red, green and blue pixels may be omitted, in a method of manufacturing the OLED display.

The white organic emission layer described in the exemplary embodiment may be formed as one organic emission layer or a plurality of organic emission layers that are laminated to emit white light. In one exemplary embodiment, for example, as the plurality of organic emission layers, at least one yellow organic emission layer and at least one blue organic emission layer may be combined to emit white light, at least one cyan organic emission layer and at least one red organic emission layer may be combined to emit white light, or at least one magenta organic emission layer and at least one green organic emission layer may be combined to emit white light.

A second electrode 730 is disposed on the pixel definition layer 190 and the organic emission layer 720. The second electrode 730 may include a transparent conducting material such as ITO, IZO, ZnO or In2O3, or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The second electrode 730 becomes the cathode of the OLED 70. The first electrode 710, the organic emission layer 720 and the second electrode 730 collectively form the OLED 70, which may otherwise be referred to as an organic light emitting element of the OLED display.

A spacer 360 is disposed on the second electrode 730. The spacer 360 maintains a predetermined interval between the substrate 100 and the encapsulation substrate 200.

The encapsulation substrate 200 is positioned on the spacer 360 and the OLED 70 is sealed between the substrate 100, the encapsulation substrate 200 and the spacer 360.

As shown in FIG. 1 and FIG. 2, the encapsulation substrate 200 includes the transmission part and the absorption part, and the absorption part includes the photoreactive crystals. The absorption part is positioned at the non-display area T2 such as including the pixel definition layer 190, and the transmission part is positioned at the display area T1 such as including the opening 195 defined in the pixel definition layer 190.

A plurality of first sensing wires (Tx) 800 and second sensing wires (Rx) 900 are disposed on one surface or both of opposing surfaces of the encapsulation substrate 200.

For better understanding and ease of description, one surface of the encapsulation substrate 200 sealed by the sealant 300 is referred to as a lower surface and the opposing other surface that is not sealed and is exposed outside is referred to as an upper surface.

The first sensing wires (Tx) 800 and the second sensing wires (Rx) 900 are insulated from each other, and in a plan view, the first sensing wires (Tx) 800 and the second sensing wires (Rx) are each elongated and cross each other thereby forming a touch panel for touch sensing. In the touch panel including the first sensing wires (Tx) 800 and the second sensing wires (Rx) as a capacitive type of touch panel, if a touch voltage is applied to the second sensing wire (Rx) 900 and the first sensing wire (Tx) 800 that are crossed with each other and any one position along the encapsulation substrate is applied with a touch implemented through a input means such as a finger or a pen, a voltage drop is generated thereby determining position coordinates of the touch.

For the first sensing wires (Tx) 800 and the second sensing wires (Rx), with respect to the encapsulation substrate 200, the second sensing wires (Rx) 900 are disposed on the upper surface of the encapsulation substrate 200 and the first sensing wires (Tx) 800 are disposed on the lower surface of the encapsulation substrate 200. Also, although not shown, the first sensing wires (Tx) 800 and the second sensing wires (Rx) may both be disposed on the upper surface of the encapsulation substrate 200, via an insulating layer therebetween.

As described above, if an additional substrate is omitted in the OLED display and the first sensing wires (Tx) 800 and the second sensing wires (Rx) are disposed on one surface or both surfaces of the single encapsulation substrate 200, the manufacturing process of the OLED display may be simplified and an overall thickness thereof may be thin.

What is claimed is:

1. An organic light emitting diode display comprising:
   a substrate;
   an encapsulation substrate facing the substrate, and comprising a transmission region through which light is transmitted and an absorption region through which the light is not transmitted;
   a sealant between the substrate and the encapsulation substrate; and
   a pixel unit between the substrate and the encapsulation substrate, and comprising a plurality of pixels respectively comprising an organic light emitting element,
   wherein the absorption region of the encapsulation substrate comprises photoreactive crystals.

2. The organic light emitting diode display of claim 1, wherein
   the photoreactive crystals comprise at least one of AgCl, AgBr and AgI.

3. The organic light emitting diode display of claim 2, wherein
   a size of the photoreactive crystals is in a range from about 50 angstroms to about 300 angstroms.

4. The organic light emitting diode display of claim 1, wherein
   the transmission region of the encapsulation substrate corresponds to a region of an organic emission layer of each organic light emitting element of the pixel unit.

5. The organic light emitting diode display of claim 4, wherein
   the absorption region of the encapsulation substrate encloses the transmission region.

6. The organic light emitting diode display of claim 1, wherein
   the pixel unit further comprises:
     a thin film transistor, and
     a pixel definition layer, and an opening defined in the pixel definition layer, and
   the organic light emitting element comprises:
     a first electrode connected to the thin film transistor;
     an organic emission layer disposed on the first electrode; and
     a second electrode disposed on the organic emission layer,
   wherein
   the opening in the pixel definition layer exposes the first electrode of the organic light emitting element, and
   the organic emission layer is within the opening in the pixel definition layer and on the first electrode exposed by the opening.

7. The organic light emitting diode display of claim 6, wherein
   the absorption region of the encapsulation substrate corresponds to the pixel definition layer of the pixel unit.

8. The organic light emitting diode display of claim 6, wherein
   the transmission region of the encapsulation substrate corresponds to the opening defined in the pixel definition layer of the pixel unit.

9. The organic light emitting diode display of claim 1, further comprising a touch panel comprising:
   a first sensing wire and a second sensing wire respectively disposed at opposing surfaces of the encapsulation substrate, and insulated from and crossing each other.

10. The organic light emitting diode display of claim 1, further comprising a touch panel comprising:
    a first sensing wire and a second sensing wire both disposed on a same surface of the encapsulation substrate, and insulated from and crossing each other.

11. A method of manufacturing an organic light emitting diode display, comprising:
- providing a substrate and an encapsulation substrate facing each other;
- providing a pixel unit comprising a plurality of pixels respectively comprising an organic light emitting element, between the substrate and the encapsulation substrate; and
- coupling the substrate and the encapsulation substrate to each other by a sealant, to seal the pixel unit therebetween;
- wherein
- the encapsulation substrate comprises a transmission region through which light is transmitted and an absorption region through which the light is not transmitted and;
- the absorption region of the encapsulation substrate comprises photoreactive crystals.

12. The method of claim 11, wherein
the photoreactive crystals include at least one of AgCl, AgBr and AgI.

13. The method of claim 12, wherein
a size of the photoreactive crystals is in a range from about 50 angstroms to about 300 angstroms.

14. The method of claim 11, wherein
the transmission region of the encapsulation substrate corresponds to a region of an organic emission layer of each organic light emitting element of the pixel unit.

\* \* \* \* \*